United States Patent
Dorr et al.

(10) Patent No.: US 7,298,167 B1
(45) Date of Patent: Nov. 20, 2007

(54) POWER SUPPLY SYSTEM

(75) Inventors: Timothy Dorr, North Attleboro, MA (US); Michael N. Robillard, Shrewsbury, MA (US); Louise Schwabe, Sterling, MA (US)

(73) Assignee: EMC Corporation, Hopkinton, MA (US)

( * ) Notice: Subject to any disclaimer, the term of this patent is extended or adjusted under 35 U.S.C. 154(b) by 267 days.

(21) Appl. No.: 11/166,822

(22) Filed: Jun. 24, 2005

(51) Int. Cl.
*G01R 31/36* (2006.01)
*G01R 31/26* (2006.01)
*G01R 31/00* (2006.01)
*G01R 19/00* (2006.01)

(52) U.S. Cl. .................. 324/771; 324/767; 324/522; 702/58; 702/64

(58) Field of Classification Search .............. 324/771, 324/767, 522; 702/58, 64
See application file for complete search history.

(56) References Cited

U.S. PATENT DOCUMENTS

| | | | | |
|---|---|---|---|---|
| 5,982,652 | A | * | 11/1999 | Simonelli et al. ........... 363/142 |
| 6,947,864 | B2 | * | 9/2005 | Garnett ...................... 702/118 |
| 7,205,681 | B2 | * | 4/2007 | Nguyen ...................... 307/18 |

\* cited by examiner

*Primary Examiner*—Anjan Deb
*Assistant Examiner*—Amy He

(57) ABSTRACT

A system for detecting a fault in a power supply having at least one power supply unit and a redundant power supply unit. The system includes a printed circuit board and a common voltage bus disposed on the printed circuit board. A plurality of diodes is disposed on the printed circuit board having first electrodes connected to the common voltage supply bus. The diodes have second electrodes connected to a corresponding one of the at least one power supply unit and the redundant power supply unit. The diodes are connected to the common bus in a logic OR configuration. A controller, disposed on the printed circuit board, is fed by a voltage at the second electrode of a corresponding one of the diodes and a reference voltage for determining whether the voltage at the second electrode of the corresponding one of the diodes is producing a predetermined voltage relative to the reference voltage.

5 Claims, 2 Drawing Sheets

POWER SUPPLY SYSTEM

TECHNICAL FIELD

This invention relates generally to power supply systems and more particularly to power supply systems having a plurality of power supply units, one of such units being provided for redundancy in the event of a power supply unit failure.

BACKGROUND

As is known in the art, many electrical systems include a power supply system and more particularly to power supply systems having a plurality of power supply units, one of such units being provided for redundancy in the event of a power supply unit failure. Such power supply systems are sometimes referred to as N+1 power supply systems where N is the number of units used in normal operation and the "1" refers to the redundant power supply unit. Thus, N may be one or more than one.

As is also known in the art, with an N+1 power supply systems it is difficult to detect a latent fault with either one of the power supply units or the cabling which connects a unit to a common power bus. More particularly, N+1 power supply systems typically have internal logic OR-ing diodes to interconnect the individual power supply units to the common power bus. If one of the N+1 power supply units fails it would be desirable to isolate the particular one of the N+1 power supply units that has failed. This is of particular use for standby voltage rails, which do not have any additional means of detecting or isolating failure.

SUMMARY

In accordance with the present invention, a system is provided for detecting a fault in a power supply having at least one power supply unit and a redundant power supply unit. The system includes a printed circuit board and a common voltage bus disposed on the printed circuit board. The system includes a plurality of diodes disposed on the printed circuit board having first electrodes connected to the common voltage supply bus and each of such diodes having second electrodes connected to a corresponding one of the at least one power supply unit and the redundant power supply unit. The plurality of diodes are connected to the common bus in a logic OR configuration. The system includes a controller, disposed on the printed circuit board, fed by a voltage at the second electrode of a corresponding one of the plurality of diodes and a reference voltage for determining whether the voltage at the second electrode of the corresponding one of the plurality of diodes is producing a proper predetermined voltage relative to the reference voltage.

In one embodiment, the second electrodes of the plurality of diodes are connected to first terminals of the printed circuit board. The first terminals are fed a first voltage produced by the corresponding one of the at least one power supply unit and the redundant power supply unit. The printed circuit board has a second terminal fed by a second voltage produced by the one of the at least one power supply unit and the redundant power supply unit. The system includes a DC-to-DC voltage converter disposed on the printed circuit, such converter being connected between the second terminal and the controller. The converter produces a second reference voltage for the controller. The controller compares the voltage at the second electrode of a corresponding one of the plurality of diodes with the first-mentioned reference voltage and in the event that such comparison indicates a fault condition, the controller compares the first-mentioned reference voltage with the second reference voltage.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
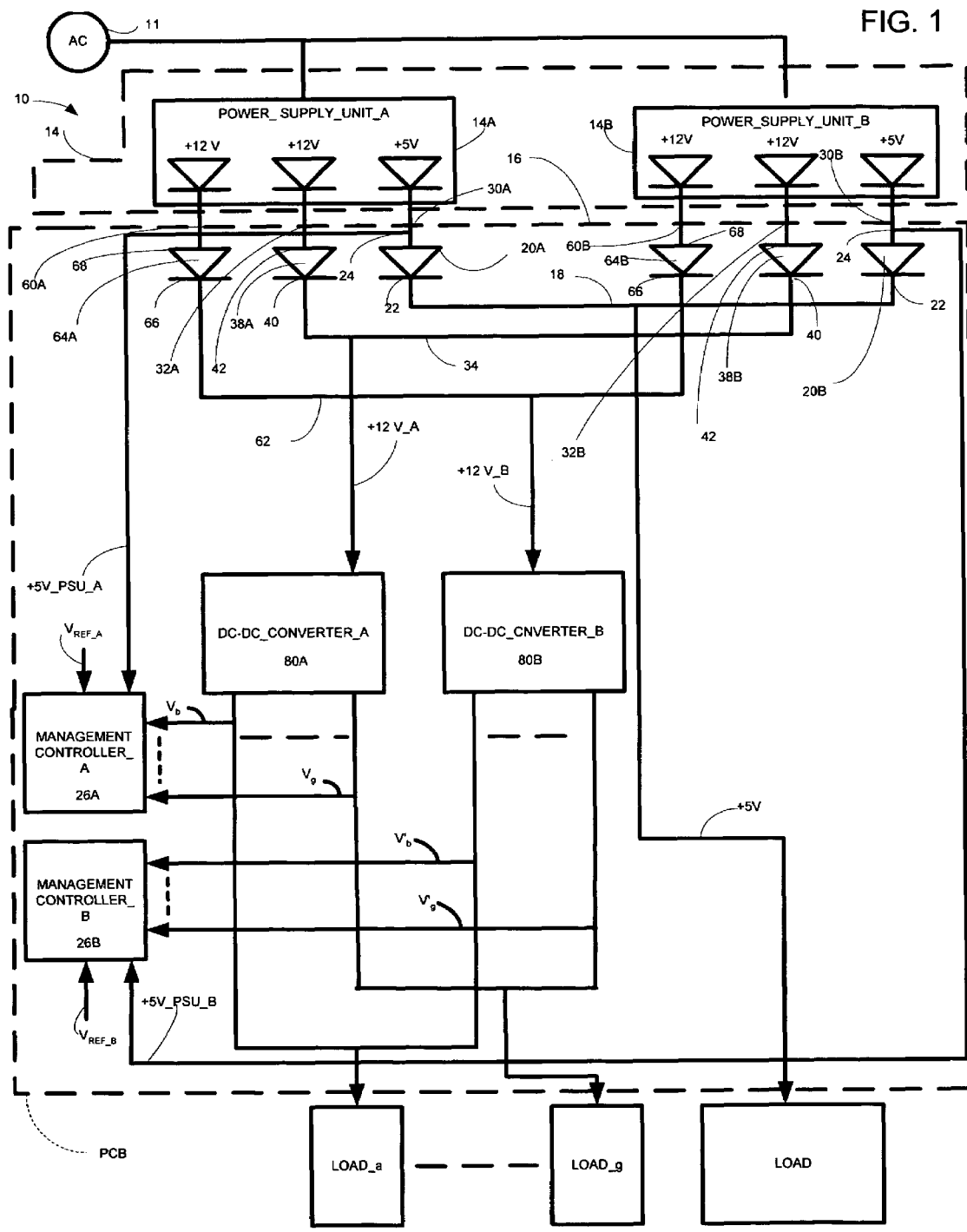
FIG. 1 is a diagram of a system for detecting a fault in a power supply having at least one power supply unit and a redundant power supply unit power supply system according to the invention connected to loads used by such power supply system.

Referring now to FIG. 1, a system 10 is shown for detecting a fault in a power supply 14. The power supply 14 is power from an ac source 11 and here produces a +5 Volt standby voltage and +12 Volts.

More particularly, the power supply 14 includes at least one power supply unit, here one power supply unit (PSU) 14A and a redundant power supply unit (PSU) 14B. The system 10 includes a printed circuit board 16 and a common voltage bus 18 disposed on the printed circuit board 16. The system 10 includes a plurality of, here two, diodes 20A, 20B disposed on the printed circuit board 16 having first electrodes, here cathodes 22, connected to the common voltage supply bus 18 and second electrodes 24, here anodes, connected to a corresponding one of the at least one power supply unit 14A and the redundant power supply unit 14B, as shown. The plurality of diodes 20A, 20B are connected to the common bus 18 in a logic OR configuration.

The system 10 includes a plurality of, here two, controllers 26A, 26B disposed on the printed circuit board 16. Each one of the controllers 26A, 26B is fed by a voltage at the second electrode 24 of a corresponding one of the plurality of diodes 20A, 20B, respectively, as shown, and a corresponding one of a plurality of, here two, reference voltages, $V_{REF\_A}$, $V_{REF\_B}$, respectively, as shown. The controllers 26A, 26B determine whether the voltage at the second electrode 24 of the corresponding one of the plurality of diodes 20A, 20B, respectively, is producing a proper predetermined voltage relative to the corresponding one of the plurality of reference voltages $V_{REF\_A}$, $V_{REF\_B}$, respectively.

The second electrodes 24 of the plurality of diodes 20A, 20B are connected to first terminals 30A, 30B, respectively, of the printed circuit board. The first terminals 30A, 30B are fed a first voltage, here the +5 Volt standby voltages produced by the corresponding one of the at least one power supply unit 14A and the redundant power supply unit 14B. It is noted that the outputs of the power supply unit 14A and the redundant power supply unit 14B are diodes, not numbered, as shown.

The printed circuit board 16 has a plurality of second terminals 32A, 32B fed by a second voltage here a known, i.e., tested internally by the power supply unit 14A and the redundant power supply unit 14B. Here, the second voltage is +12 Volts The printed circuit board 16 includes a second common voltage bus 34. A second plurality of, here two, diodes 38A, 38B is disposed on the printed circuit board 16 and have first electrodes 40, here cathodes, connected to the second common voltage supply bus 34 and second electrodes 42, here anodes, connected to a corresponding one of the plurality of second terminals 32A, 32B, respectively, as shown. The second plurality of diodes 38A, 38B are connected to the second common bus 34 in a logic OR configuration.

The printed circuit board 16 has a plurality of third terminals 60A, 60B fed by a third voltage here a known, i.e., tested internally by the power supply unit 14A and the redundant power supply unit 14B. Here, the third voltage is +12 Volts The printed circuit board 16 includes a third common voltage bus 62. A third plurality of, here two, diodes 64A, 64B is disposed on the printed circuit board 16 and have first electrodes 66, here cathodes, connected to the third common voltage supply bus 62 and second electrodes 68, here anodes, connected to a corresponding one of the plurality of third terminals 60A, 60B, respectively, as shown. The third plurality of diodes 64A, 64B are connected to the third common bus 62 in a logic OR configuration.

The system includes a pair of voltage-to-voltage converters 80A, 80B disposed on the printed circuit 16. The converter 80A is connected between the second common bus 34 to feed the one of the plurality of controllers 26A, 26B, here controller 26A, the voltage produced on the second common bus 34 after converting said voltage to a plurality of second reference voltages, here voltages $V_b$-$V_g$. It is noted these second reference voltages $V_b$-$V_g$ are known tested voltages because the +12 Volts has been tested internally, as described above.

Likewise, the converter 80B is connected between the third common bus 62 to feed the other one of the plurality of controllers 26A, 26B, here controller 26B, the voltage produced on the third common bus 62 after converting said voltage to a plurality of second reference voltages, here voltages $V'_b$-$V'_g$. It is noted these second reference voltages $V'_b$-$V'_g$ are known tested voltages because the +12 Volts has been tested internally, as described above.

By adding external monitoring points +5V_PSU_A and +5V_PSU_B at the second electrodes 24 of the diodes 20A, 20B, respectively, the controllers 26A, 6B (e.g., microcontrollers programmed to perform the process to be described in connection with FIG. 2), compares the voltages measured at +5V_PSU_A and +5V_PSU_B, with a known good references ($V_{REF\_A}$ and $V_{REF\_B}$, respectively). In the event that comparing +5V_PSU_A against $V_{REF\_A}$ indicates a fault condition, the controller 26A checks $V_{REF\_A}$ against other known voltages on the board ($V_b$ through $V_g$). If, as a result of the comparison, the reference voltage $V_{REF\_A}$ appears correct as compared with at least one of the known voltages on the board ($V_b$ through $V_g$), the controller 26A deduces that $V_{REF\_A}$ is correct and +5V_PSU_A is faulty. If, as a result of the comparison, the reference voltage $V_{REF\_A}$ does not appear correct as compared with at least one of the known voltages on the board ($V_b$ through $V_g$), the controller 26A deduces that $V_{REF\_A}$ is incorrect and +5V_PSU_A is good.

Likewise, in the event that comparing +5V_PSU_B against $V_{REF\_B}$ indicates a fault condition, the controllers 26B checks $V_{REF\_B}$ against other known voltages on the board ($V'_b$ through $V'_g$). If at least one other voltage appears correct, the controller 26B deduces that $V_{REF\_B}$ is correct and +5V_PSU_B is faulty. If none of the other voltages appear correct, the controller 26B deduces that $V_{REF\_B}$ is incorrect and +5V_PSU_B is good.

The output of the converters 80A and 80B are wired in a logic OR configuration and are fed to loads LOAD_b to LOAD_g, respectively. The output voltage on the first-mentioned common bus 18 is fed to a LOAD, as indicated.

Figure 2:
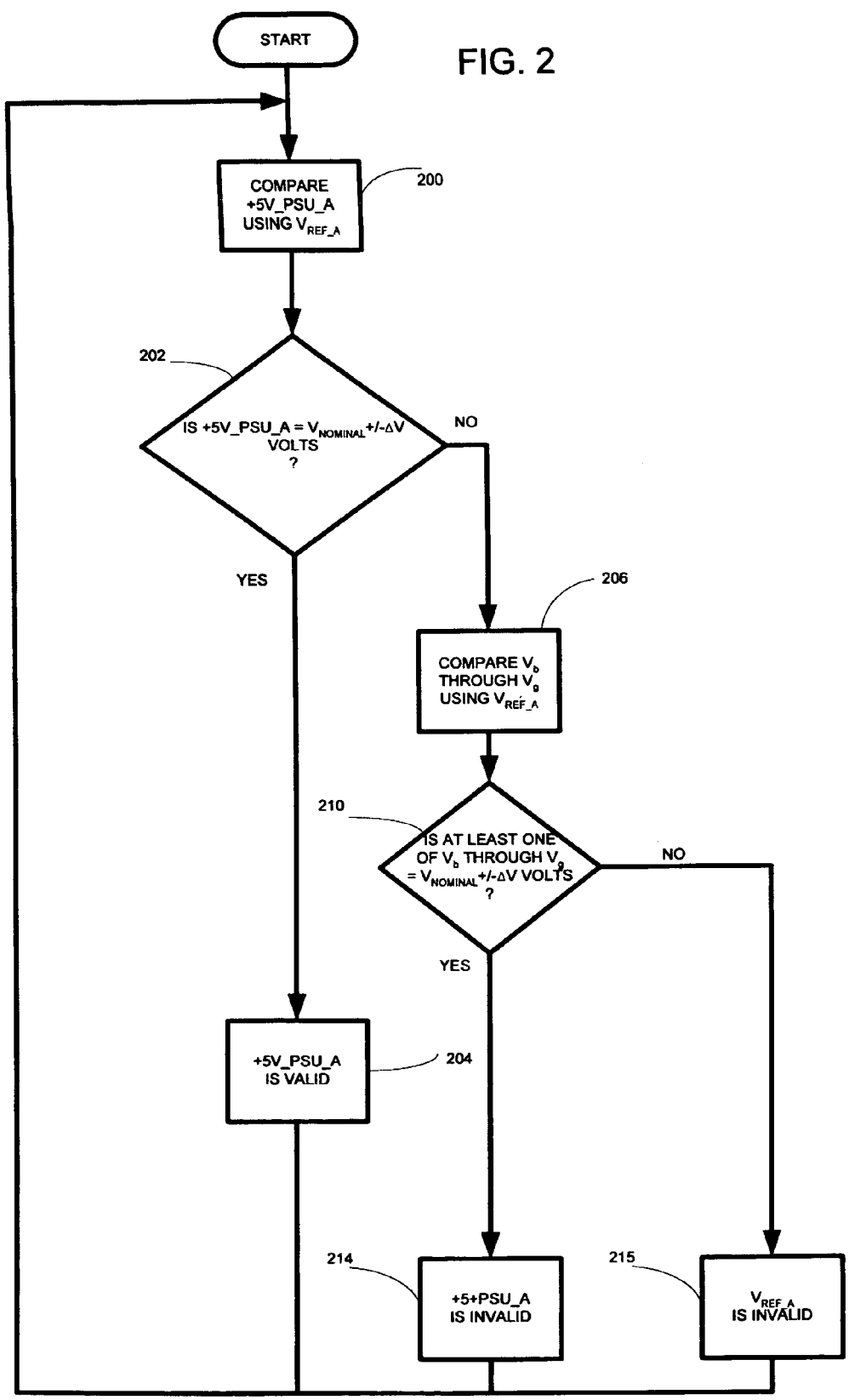
FIG. 2 is a flow diagram of a process used by the power supply system of FIG. 1 for detecting a fault in the power supply in accordance with the invention.

Referring now to FIG. 2, and considering one of the controllers, here controller 26A and recognizing that controller 26B operates in like manner, the process compares the voltage at the second electrode 24 (FIG. 1), i.e., the voltage +5_PSU_A with the reference voltage $V_{REF\_A}$, Step 200.

If in Step 202 the voltage +5_PSU_A is equal to the reference voltage $V_{REF\_A}$ to within a tolerance of $\Delta V_a$, the voltage +5_PSU_A is considered valid, Step 204, and the process returns to Step 200.

On the other hand, if in Step 202 the voltage +5_PSU_A is not equal to the reference voltage $V_{REF\_A}$ to within a tolerance of $\Delta V_a$, the process compares the reference voltage $V_{REF\_A}$ with each of the reference voltages $V_b$ through $V_g$, Step 206. If, in Step 210, at least one of these $V_b$ through $V_g$ compares properly with the reference voltage $V_{REF\_A}$, the voltage +5_PSU_A is considered invalid, Step 214, and such condition is reported by a communication link to a remote station, not shown.

On the other hand, if in Step 202 the voltage +5_PSU_A is not equal to the reference voltage $V_{REF\_A}$ to within a tolerance of $\Delta V_a$, and in Step 210 the process determines that none of the voltages $V_b$ through $V_g$ compares properly with the reference voltage $V_{REF\_A}$, the process determines that the voltage Vref_A is considered invalid in Step 215 and the process returns to Step 200.

The process is repeated by controller 26B in like manner thereby enabling the remote station to know whether the fault is in power supply unit 14A or 14B, i.e., whether the fault is at +5_PSU_A or +5_PSU_B.

While the process described above may be implemented in the controller with many different instructions the controller may be programmed with the following psuedocode:

```
VREF_VALID = 0
FOR (Vtemp = Va through Vg)
{
    IF (Vtemp > V_MIN_THRESHOLD AND Vtemp < V_MAX_THRESHOLD)
    {
        \\ Voltage is OK, no fault detected.
        \\ Vref is valid.
        VREF_VALID = 1
    }
}
IF (VREF_VALID = 0)
    {
    \\ Vref is BAD, report fault to user.
    }
IF ((Va < V_MIN_THRESHOLD OR Va > V_MAX_THRESHOLD)
AND VREF_VALID = 1)
    {
    \\ Va is BAD, report fault to user.
    }
``` where Va=5V_PSU_A

A number of embodiments of the invention have been described. Nevertheless, it will be understood that various modifications may be made without departing from the spirit and scope of the invention. Accordingly, other embodiments are within the scope of the following claims.

What is claimed is:

1. A system for detecting a fault in a power supply having at least one power supply unit and a redundant power supply unit, such system comprising:
   a printed circuit board;
   a common voltage bus disposed on the printed circuit board;
   a plurality of diodes disposed on the printed circuit board having first electrodes connected to the common voltage supply bus and each of such diodes having second electrodes connected to a corresponding one of the at least one power supply unit and the redundant power supply unit, such plurality of diodes being connected to the common bus in a logic OR configuration;
   a controller, disposed on the printed circuit board fed by a voltage at the second electrode of a corresponding one of the plurality of diodes and a reference voltage for determining whether the voltage at the second electrode of the corresponding one of the plurality of diodes is at a proper predetermined voltage relative to the reference voltage;
   wherein:
      the second electrodes of the plurality of diodes are connected to first terminals of the printed circuit board and wherein the first terminals are fed a first voltage produced by the corresponding one of the at least one power supply unit and the redundant power supply unit;
   wherein the printed circuit board has a second terminal fed by a second voltage produced by the one of the at least one power supply unit and the redundant power supply unit;
   wherein the system includes:
   a voltage to voltage converter disposed on the printed circuit, such converter being connected between the second terminal and the controller, said converter producing a second reference voltage for the controller; and
   wherein:
      the controller compares the voltage at the second electrode of a corresponding one of the plurality of diodes with the first-mentioned reference voltage and in the event that such comparison indicates a fault condition, the controller compares the first-mentioned reference voltage with the second reference voltage.

2. A system for detecting a fault in a power supply having at least one power supply unit and a redundant power supply unit, such system comprising:
   a printed circuit board;
   a common voltage bus disposed on the printed circuit board;
   a plurality of diodes disposed on the printed circuit board having first electrodes connected to the common voltage supply bus and each of such diodes having second electrodes connected to a corresponding one of the at least one power supply unit and the redundant power supply unit, such plurality of diodes being connected to the common bus in a logic OR configuration;
   a plurality of controllers disposed on the printed circuit board, each one being fed by a voltage at the second electrode of a corresponding one of the plurality of diodes and a corresponding one of a plurality of reference voltages for determining whether the voltage at the second electrode of the corresponding one of the plurality of diodes is at a proper predetermined voltage relative to the corresponding one of the plurality of reference voltages; wherein:
      the second electrodes of the plurality of diodes are connected to first terminals of the printed circuit board and wherein the first terminals are fed a first voltage produced by the corresponding one of the at least one power supply unit and the redundant power supply unit;
   wherein the printed circuit board has a plurality of second terminals fed by a second voltage produced by the corresponding one of the at least one power supply unit and the redundant power supply unit and including:
   a second common voltage bus disposed on the printed circuit board;
   a second plurality of diodes disposed on the printed circuit board having first electrodes connected to the second common voltage supply bus and each of such second plurality of diodes having second electrodes connected to a corresponding one of the plurality of second terminals, such second plurality of diodes being connected to the second common bus in a logic OR configuration.

3. The system recited in claim 2 includes a voltage to voltage converter disposed on the printed circuit, such converter being connected between the second common bus to feed the one of the plurality of controllers said voltage produced on the second common bus after converting said voltage to a different voltage level.

4. The system recited in claim 3 wherein the printed circuit board has a plurality of third terminals fed by a third voltage produced by the corresponding one of the at least one power supply unit and the redundant power supply unit and including:
   a third common voltage bus disposed on the printed circuit board;
   a third plurality of diodes disposed on the printed circuit board having first electrodes connected to the third common voltage supply bus and each of such third plurality of diodes having second electrodes connected to a corresponding one of the plurality of third terminals, such third plurality of diodes being connected to the third common bus in a logic OR configuration.

5. The system recited in claim 4 includes a second voltage to voltage converter disposed on the printed circuit, such second converter being connected between the third common bus to feed a second one of the plurality of controllers said voltage produced on the third common bus after converting said voltage to a different voltage level.

* * * * *